(12) United States Patent
Li et al.

(10) Patent No.: US 12,342,654 B2
(45) Date of Patent: Jun. 24, 2025

(54) METHOD FOR PREPARING SOLAR CELL, AND SOLAR CELL

(71) Applicants: ZHEJIANG JINKO SOLAR CO., LTD., Zhejiang (CN); JINKO SOLAR CO., LTD., Jiangxi (CN)

(72) Inventors: Wenqi Li, Zhejiang (CN); Shijie Zhao, Zhejiang (CN); Xiaowen Zhang, Zhejiang (CN); Jie Yang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/328,697

(22) Filed: Jun. 2, 2023

(65) Prior Publication Data

US 2024/0178341 A1    May 30, 2024

(30) Foreign Application Priority Data

Nov. 24, 2022  (CN) .......................... 202211485637.5

(51) Int. Cl.
  H10F 71/00     (2025.01)
  H10F 77/20     (2025.01)
  (Continued)

(52) U.S. Cl.
  CPC ......... H10F 71/129 (2025.01); H10F 77/211 (2025.01); H10F 77/311 (2025.01); H10F 77/703 (2025.01)

(58) Field of Classification Search
  CPC ....... H01L 31/02167; H01L 31/022425; H01L 31/02363; H01L 31/068; H01L 31/0745;
  (Continued)

(56) References Cited

U.S. PATENT DOCUMENTS

2020/0365746 A1   11/2020   Zhao
2023/0058215 A1*  2/2023    Li ........................ H10F 10/166

FOREIGN PATENT DOCUMENTS

AU   2020203989 B1 *  2/2021  ....... H01L 31/02167
AU   2022204453 A1    7/2022
CN   115312629 A      11/2022

OTHER PUBLICATIONS

Zhejiang Jinko Solar Co., Ltd., et al., Extended European Search Report, EP 23176200.6, Apr. 11, 2024, 10 pgs.

* cited by examiner

*Primary Examiner* — Golam Mowla
(74) *Attorney, Agent, or Firm* — USCH Law, PC

(57) ABSTRACT

The method for preparing a solar cell includes providing a substrate having a first surface and a second surface opposite to the first surface; forming a doped layer and a first passivation layer stacked sequentially in a direction away from the substrate on the first surface; forming a second passivation layer on the second surface; forming multiple first grid line electrodes arranged at intervals on the surface of the first passivation layer away from the substrate, and forming multiple second grid line electrodes arranged at intervals on the surface of the second passivation layer away from the substrate; performing a laser processing on the multiple first grid line electrodes and an adjacent region of the multiple first grid line electrodes, and applying a reverse current between the multiple first grid line electrodes and the multiple second grid line electrodes.

19 Claims, 5 Drawing Sheets

(51) Int. Cl.
*H10F 77/30* (2025.01)
*H10F 77/70* (2025.01)

(58) Field of Classification Search
CPC . H01L 31/1804; H01L 31/1868; H10F 10/14; H10F 10/165; H10F 71/121; H10F 71/129; H10F 77/211; H10F 77/311; H10F 77/703
See application file for complete search history.

METHOD FOR PREPARING SOLAR CELL, AND SOLAR CELL

CROSS-REFERENCE TO RELATED APPLICATION

The present application claims the benefit of priority under the Paris Convention to Chinese Patent Application No. 202211485637.5 filed on Nov. 24, 2022, which is incorporated herein by reference in its entirety.

TECHNICAL FIELD

Embodiments of the present disclosure relate to the field of solar cells, and in particular to a method for preparing a solar cell, and the solar cell.

BACKGROUND

A solar cell has desirable photoelectric conversion capability. In the solar cell, metallization process needs to be carried out on a surface of a silicon wafer to form multiple fingers gates and busbars, to collect the current generated by the silicon wafer. Generally, the metallization process includes a sintering operation to sinter metal paste printed on the surface of the silicon wafer, so that the metal paste can penetrate a passivation layer to be in electrical contact with a doped conductive layer or an emitter, the metal paste is configured to collect carriers in the doped conductive layer.

However, the photovoltaic conversion performance of the solar cell obtained by using the method for preparing grid lines in the conventional art is poor.

SUMMARY

Embodiments of the present disclosure provide a method for preparing a solar cell and the solar cell, which is at least conducive to improving the photoelectric conversion performance of the solar cell.

In a first aspect, a method for preparing a solar cell is provided according to some embodiments of the present disclosure, and the method includes: providing a substrate having a first surface and a second surface opposite to the first surface; forming a doped layer over the first surface of the substrate and a first passivation layer over the doped layer, where the doped layer forms a PN junction with the substrate. The method further includes forming a second passivation layer on the second surface, performing a sintering process on a surface of the first passivation layer away from the substrate to form multiple first grid line electrodes arranged at intervals on the surface of the first passivation layer, performing a sintering process on a surface of the second passivation layer away from the substrate to form multiple second grid line electrodes arranged at intervals on the surface of the second passivation layer; and performing laser processing on the multiple first grid line electrodes and regions adjacent the multiple first grid line electrodes, where a reverse current is applied between the multiple first grid line electrodes and the multiple second grid line electrodes to reverse bias the PN junction during the laser processing, and the each of the regions adjacent the multiple first gridline electrodes is a region within a preset distance from an edge of one of the multiple first grid line electrodes.

In some embodiments, the preset distance is not greater than 1.5 cm.

In some embodiments, the laser processing has a power of 1 W to 60 W and a scanning speed of 2000 mm/s to 50000 mm/s.

In some embodiments, performing the laser processing on the multiple first grid line electrodes and the adjacent region of the multiple first grid line electrodes includes: continuously scanning the adjacent region of the multiple first grid line electrodes and the multiple first grid line electrodes using a laser device to form a laser processed region in the adjacent region of the multiple first grid line electrodes and the multiple first grid line electrodes, where a projection of the laser processed region on the surface of the first passivation layer away from the substrate covers the adjacent region of the multiple first grid line electrodes and the multiple first grid line electrodes.

In some embodiments, performing the laser processing on the multiple first grid line electrodes and the adjacent region of the multiple first grid line electrodes includes: discontinuously scanning the adjacent region of the multiple first grid line electrodes and the multiple first grid line electrodes using a laser device to form multiple laser processed regions spaced apart from each other in the adjacent region of the multiple first grid line electrodes and the multiple first grid line electrodes.

In some embodiments, the laser device is a nanosecond level green laser device having a pulse width of 1 ns to 200 ns, a laser power of 1 W to 30 W, and a scanning speed of 2000 mm/s to 50000 mm/s.

In some embodiments, the reverse current is between 1 A and 40 A.

In some embodiments, applying the reverse current between the multiple first grid line electrodes and the multiple second grid line electrodes includes: providing a power supply, electrically connecting a negative electrode of the power supply to one of the multiple first grid line electrodes or the multiple second grid line electrodes, electrically connecting a positive electrode of the power supply to the other one of the multiple first grid line electrodes or the multiple second grid line electrodes to apply the reverse current between the multiple first grid line electrodes and the multiple second grid line electrodes.

In some embodiments, the doped layer has P-type doping elements, and the substrate has N-type doping elements.

In some embodiments, applying the reverse current between the multiple first grid line electrodes and the multiple second grid line electrodes includes: electrically connecting the negative electrode of the power supply to the multiple first grid line electrodes, and electrically connecting the positive electrode of the power supply to the multiple second grid line electrodes.

In some embodiments, the power supply further includes a fixture, where the multiple first grid line electrodes are electrically connected to the negative electrode of the power supply by the fixture, the fixture is electrically connected to the negative electrode of the power supply, and the fixture is further in electrical contact with at least an end of each of the multiple first grid line electrodes.

In some embodiments, performing the laser processing on the multiple first grid line electrodes and the adjacent region of the multiple first grid line electrodes further includes controlling temperature of the adjacent region of the multiple first grid line electrodes and the multiple first grid line electrodes to be less than or equal to 50 degrees Celsius.

In some embodiments, performing a sintering process on a surface of the first passivation layer away from the substrate to form multiple first grid line electrodes arranged at intervals on the surface of the first passivation layer away from the substrate includes: printing metal paste on a part the surface of the first passivation layer away from the substrate where the multiple first grid line electrodes and the multiple second grid line electrodes are to be formed; and performing undersintering treatment on the metal paste to enable the metal paste to penetrate through the first passivation layer to be in electrical contact with the doped layer.

In some embodiments, a peak temperature of the undersintering treatment is between 200 degrees Celsius and 750 degrees Celsius.

In some embodiments, the doped layer has a same material as the substrate, and the multiple first grid line electrodes are electrically connected to the doped layer.

In some embodiments, the doped layer includes a first tunneling layer and a first doped conductive layer sequentially stacked in the direction away from the substrate, the first doped conductive layer has different types of doping elements from the substrate, and the multiple first grid line electrodes are electrically connected to the first doped conductive layer.

In some embodiments, the second passivation layer at least includes a second tunneling layer and a second doped conductive layer sequentially stacked in the direction away from the substrate, the second doped conductive layer has a same type of doping elements as the substrate, and the multiple second grid line electrodes are electrically connected to the first doped conductive layer.

In some embodiments, a material of the first passivation layer is at least one of silicon oxide, silicon nitride, aluminum oxide or silicon oxynitride.

In some embodiments, a material of the second passivation layer is at least one of silicon oxide, silicon nitride, aluminum oxide or silicon oxynitride.

In a second aspect, a solar cell is further provided according to the embodiments of the present disclosure. The solar cell is prepared by using the method for preparing a solar cell according to any one above, and the solar cell includes a substrate having a first surface and a second surface opposite to the first surface; a doped layer and a first passivation layer stacked sequentially in a direction away from the substrate on the first surface, where the doped layer forms a PN junction with the substrate; a second passivation layer on the second surface; multiple first grid line electrodes arranged at intervals on a surface of the first passivation layer away from the substrate; and multiple second grid line electrodes arranged at intervals on a surface of the second passivation layer away from the substrate.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated.

DETAILED DESCRIPTION

It can be seen from the background technology that the photoelectric conversion efficiency of the solar cell obtained by the preparing process of grid lines in the conventional art are not desirable.

A method for preparing a solar cell is provided according to some embodiments of the present disclosure, in which a laser processing is performed on the multiple first grid line electrodes and an adjacent region of the multiple first grid line electrodes on the first surface, and a reverse current is applied between the multiple first grid line electrodes and the multiple second grid line electrodes to reverse bias the PN junction. Under laser irradiation, a large number of carriers are generated in the multiple first grid line electrodes and an adjacent region of the multiple first grid line electrodes. In addition, due to the reverse bias of the PN junction, electrons in the carriers can be trapped in the doped layer and on a surface of each of the multiple first grid line electrodes, which in turn reacts with the multiple first grid line electrodes, to promote the precipitation of metal ions in the multiple first grid line electrodes to form metal micelles. The metal micelles form conductive contact points in the doped layer and the first passivation layer, which can reduce the contact impedance, thus improving the filling factor of the solar cell and improving the photoelectric conversion efficiency of the solar cell.

The embodiments of the present disclosure will be described in detail below with reference to the accompanying drawings. However, those of ordinary skill in the art shall understand that, in each embodiment of the present disclosure, many technical details are provided for readers to better understand the present disclosure. However, the technical solutions claimed in the present disclosure can be realized even without these technical details and various changes and modifications based on the following embodiments.

Figure 1:
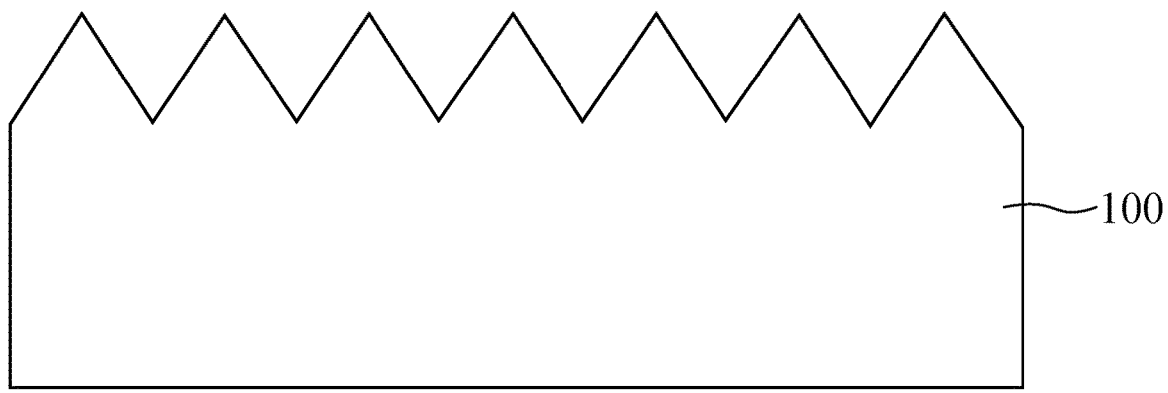
FIG. 1 is a cross-sectional view of a solar cell corresponding to an operation of providing a substrate in a method for preparing a solar cell provided according to an embodiment of the present disclosure.

FIG. 1 is a cross-sectional view of a solar cell corresponding to an operation of providing a substrate in a method for preparing a solar cell provided according to an embodiment of the Referring to FIG. 1, a substrate 100 is provided, which has a first surface and a second surface opposite to the first surface.

The substrate 100 is configured to receive incident light and generate photogenerated carriers. In some embodiments, the substrate 100 may be made of at least one of monocrystalline silicon, polycrystalline silicon, amorphous silicon, or microcrystalline silicon. In some embodiments, the substrate 100 is a N-type substrate, that is, the substrate 100 is doped with N-type ions, where the N-type doping ions may be any one of phosphorus (P) element, arsenic (As) element, or antimony (Sb) element. In some embodiments, the substrate 100 is a P-type substrate, that is, the substrate 100 is doped with P-type ions, where the P-type doping ions may be any one of boron (B) element, gallium (Ga) element, or indium (In) element.

The first surface and the second surface of the substrate 100 are both configured to receive incident or reflected light. In some embodiments, the first surface is the rear surface of the substrate 100, and the second surface is the front surface of the substrate 100. In some embodiments, the first surface is the front surface of the substrate 100, and the second surface is the rear surface of the substrate 100.

In some embodiments, the first surface and the second surface of the substrate 100 are textured to form a pyramid textured surface on the first surface and the second surface of the substrate 100, thereby enhancing the absorption and utilization of incident light on the first surface and the second surface of the substrate 100. In some embodiments, one of the first surface and the second surface of the substrate 100 is a pyramid textured surface, and the other of the first surface and the second surface is a non pyramid textured surface, such as a stacked step morphology, resulting in a higher density and uniformity of the film layer formed on the stacked step morphology, thereby improving the quality of the formed film layer.

In some embodiments, the solar cell is a tunnel oxide passivated contact (TOPCON) cell. In some embodiments, the solar cell is a passivated emitter and rear cell (PERC) or a heterojunction technology solar (HJT) cell.

Figure 2:
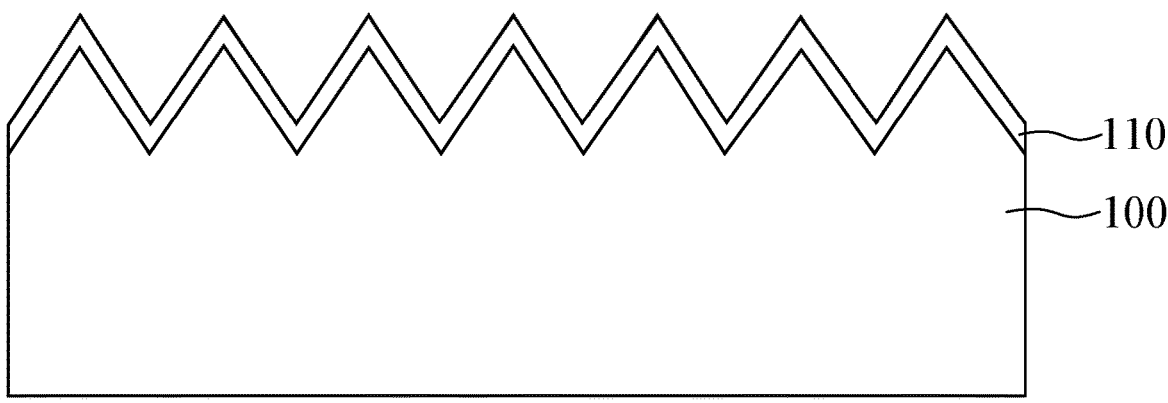
FIG. 2 is a cross-sectional view of a solar cell corresponding to an operation of forming a doped layer in a method for preparing a solar cell provided according to an embodiment of the present disclosure.
Figure 3:
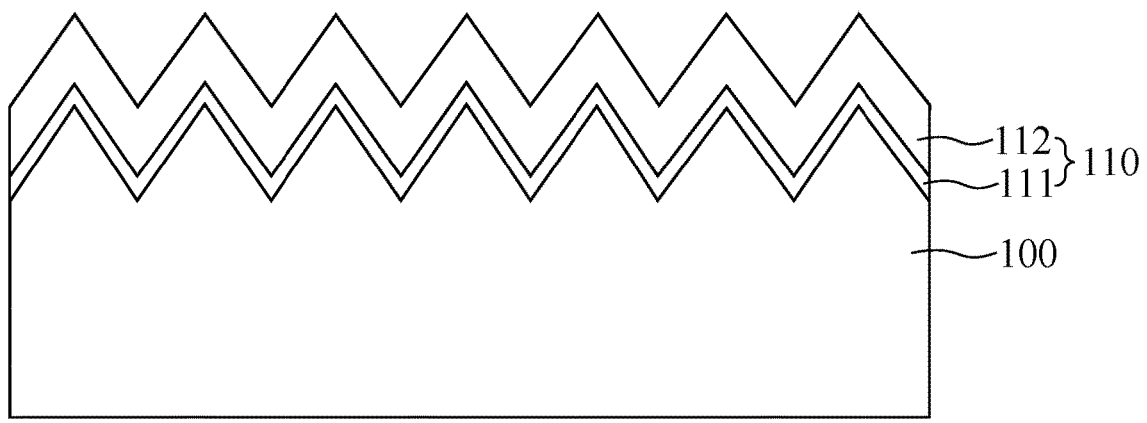
FIG. 3 is a cross-sectional view of another solar cell corresponding to an operation of forming a doped layer in a method for preparing a solar cell provided according to an embodiment of the present disclosure.
Figure 4:
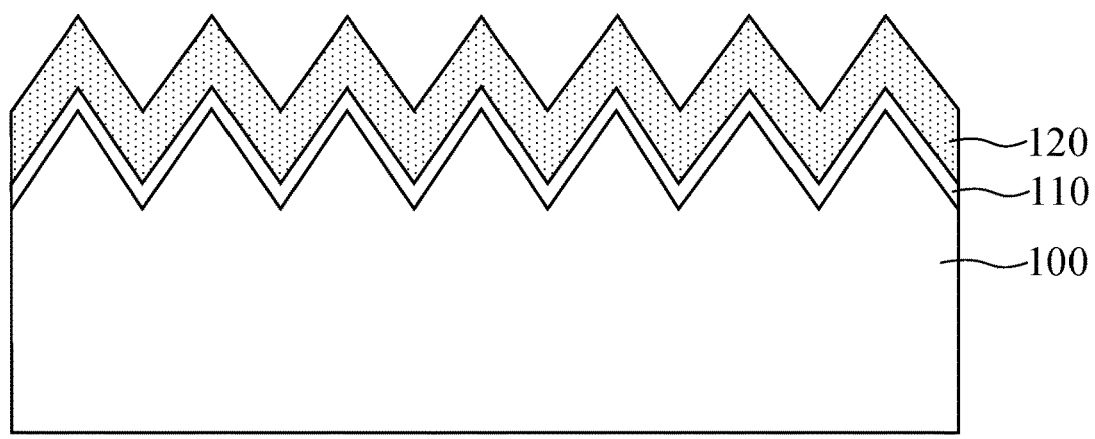
FIG. 4 is a cross-sectional view of a solar cell corresponding to an operation of forming a first passivation layer in a method for preparing a solar cell provided according to an embodiment of the present disclosure.

Referring to FIG. 2 to FIG. 4, a doped layer 110 and a first passivation layer 120 are formed on the first surface in a direction away from the substrate 100. The doped layer 110 forms a PN junction with the substrate 100. The PN junction can receive incident light irradiating on the first surface of the substrate 100 and generate electron hole pairs. In response to the substrate 100 being an N-type substrate, the separated electrons move into the substrate 100 and the separated holes move into the doped layer 110.

In some embodiments, the material of the doped layer is the same as that of the substrate 100, and the doped layer 110 is served as the emitter of the solar cell. The doped layer 110 is a single-layer structure, and the doped layer 110 has different types of doping elements from the substrate 100, to form a PN junction with the substrate 100.

In some embodiments, in response to the doped layer 110 being served as the emitter, an operation of forming the doped layer 110 includes the following operations.

Referring to FIG. 2, an initial substrate is provided, and a diffusion process is performed on a surface of the initial substrate to diffuse doped elements into a part of the initial substrate, to form the doped layer 110. The part of the initial substrate other than the doped layer 110 forms a substrate 100. In some embodiments, in response to the substrate 100 being an N-type substrate, boron diffusion treatment can be applied to the surface of the initial substrate, and in response to the substrate 100 being a P-type substrate, phosphorus diffusion treatment can be applied to the surface of the initial substrate.

Referring to FIG. 3, in some embodiments, the doped layer 110 includes: a first tunneling layer 111 and a first doped conductive layer 112 stacked sequentially in a direction away from the substrate 100. The first doped conductive layer 112 has different types of doping elements from the substrate 100. The first tunneling layer 111 and the first doped conductive layer 112 are configured to form a passivated contact structure. In some embodiments, in response to the doped layer 110 being a passivated contact structure, and the first doped conductive layer 112 in the passivated contact structure forming a PN junction with the substrate 100, the first surface can be the rear surface of the substrate 100 to form a rear PN junction. The rear PN junction refers to the PN junction formed on the rear surface of the substrate 100.

The first doped conductive layer 112 is configured to form a field passivation layer. The field passivation effect is to form an electrostatic field pointing to the interior of the substrate 100 at the interface of the substrate 100, so that minority carriers escape from the interface, which reduces the concentration of the minority carriers, and makes the recombination rate of carriers at the interface of the substrate 100 low, thus increasing the open circuit voltage, the short circuit current and the filling factor of the solar cell, and improving the photoelectric conversion performance of the solar cell. In some embodiments, the material of the first doped conductive layer 112 may be at least one of amorphous silicon, polycrystalline silicon, or silicon carbide.

The first tunneling layer 111 is in direct contact with the first surface of the substrate 100. The first tunneling layer 111 is configured to realize the interface passivation of the first surface of the substrate 100, and realize a chemical passivation effect, which promotes the recombination of photogenerated carriers, and improves the filling factor and the photoelectric conversion efficiency of the solar cell. In some embodiments, the material of the first tunneling layer 111 may be a dielectric material, such as at least one of silicon oxide, aluminum oxide, silicon nitride, silicon oxynitride, amorphous silicon or polycrystalline silicon.

In some embodiments, the operation of forming the first tunneling layer 111 and the first doped conductive layer 112 includes the following operations.

Referring to FIG. 3, a first tunneling layer 111 is formed on the first surface of the substrate 100 using a deposition process, such as chemical vapor deposition. In some embodiments, in response to the material of the first tunneling layer 111 being silicon oxide, an in-situ generation process can also be used to form the first tunneling layer 111, for example, a thermal oxidation process or nitric acid passivation process can be used to generate the first tunneling layer 111 on the first surface of the substrate 100.

After the first tunneling layer 111 is formed, an amorphous silicon layer is formed on a surface of the first tunneling layer 111 away from the substrate 100 using a deposition process. After that, a crystallization process is carried out on the amorphous silicon layer to convert it into a polycrystalline silicon layer. After the polycrystalline silicon layer is formed, a doping process can be carried out on the polycrystalline silicon layer to form a first doped conductive layer 112. Specifically, conductive ions can be doped in the polycrystalline silicon layer through ion implantation or source diffusion, such as phosphorus ions or boron ions.

The first passivation layer 120 can have a good passivation effect on the first surface of substrate 100, for example, the first passivation layer 120 can chemically passivate the hanging bonds on the first surface of substrate 100, which reduces the density of defect states on the first surface of substrate 100, and effectively suppresses carrier recombination on the first surface of substrate 100. In some embodiments, the first passivation layer 120 may be a single-layer structure, while in other embodiments, the first passivation layer 120 may also be a multi-layer structure. In some embodiments, the material of the first passivation layer 120 may be at least one of silicon oxide, aluminum oxide, silicon nitride or silicon oxynitride.

Referring to FIG. 4, in some embodiments, the operation of forming the first passivation layer 120 includes: forming the first passivation layer 120 on the surface of the doped layer 110 away from the substrate 100 using plasma enhanced chemical vapor deposition (PECVD).

Figure 5:
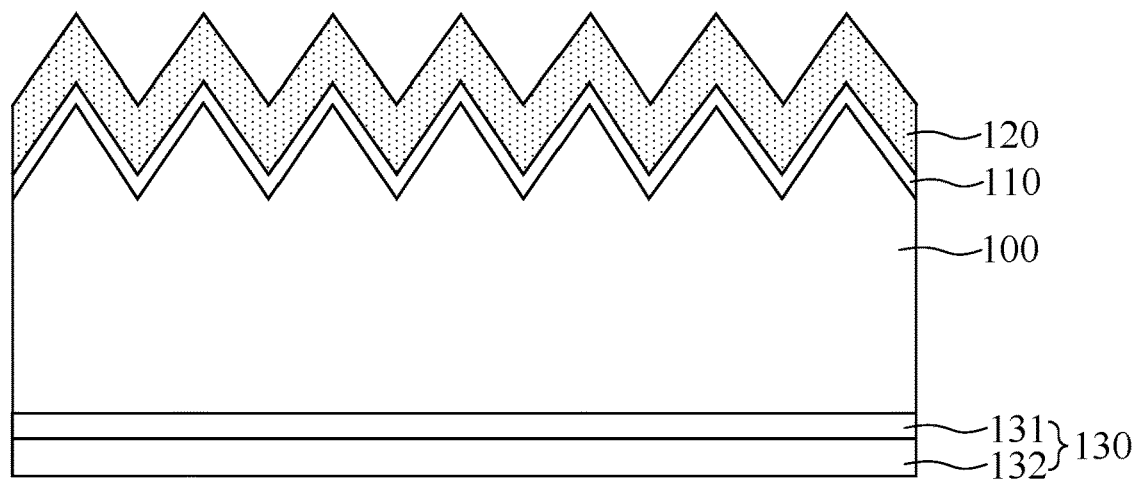
FIG. 5 is a cross-sectional view of another solar cell corresponding to an operation of forming a second passivation layer in a method for preparing a solar cell provided according to an embodiment of the present disclosure.

Referring to FIG. 5, a second passivation layer 130 is formed on the second surface.

In some embodiments, the second passivation layer 130 includes at least a second tunneling layer 131 and a second doped conductive layer 132 sequentially stacked in a direction away from the substrate 100. The second doped conductive layer 132 has the same type of doping elements as the substrate 100. That is to say, the second passivation layer 130 is configured to form a passivation contact structure.

In some embodiments, in response to the doped layer 110 being served as the emitter, the second passivation layer 130 forms a passivation contact structure, resulting in a TOP-CON solar cell.

In some embodiments, in response to the second passivation layer 130 including a second tunneling layer 131 and a second doped conductive layer 132, the operation of forming the second tunneling layer 131 and the second doped conductive layer 132 is similar to the operation of forming the first tunneling layer 111 and the first doped conductive layer 112 mentioned above, which will not be further described below.

In some embodiments, the material of the second tunneling layer 131 is a dielectric material, such as at least one of silicon oxide, aluminum oxide, silicon nitride, silicon oxynitride, amorphous silicon or polycrystalline silicon, and the material of the second doped conductive layer 132 is at least one of amorphous silicon, polycrystalline silicon, and silicon carbide.

It can be understood that due to the PN junction formed between the doped layer 110 located on the first surface and the substrate 100, the second doped conductive layer 132 has the same type of doping elements as the substrate 100, so that the second doped conductive layer 132 forms a high and low junction with the substrate 100, which can generate a barrier effect on the current carriers and increase the rate of transporting carriers from the substrate 100 to the second doped conductive layer 132.

Figure 6:
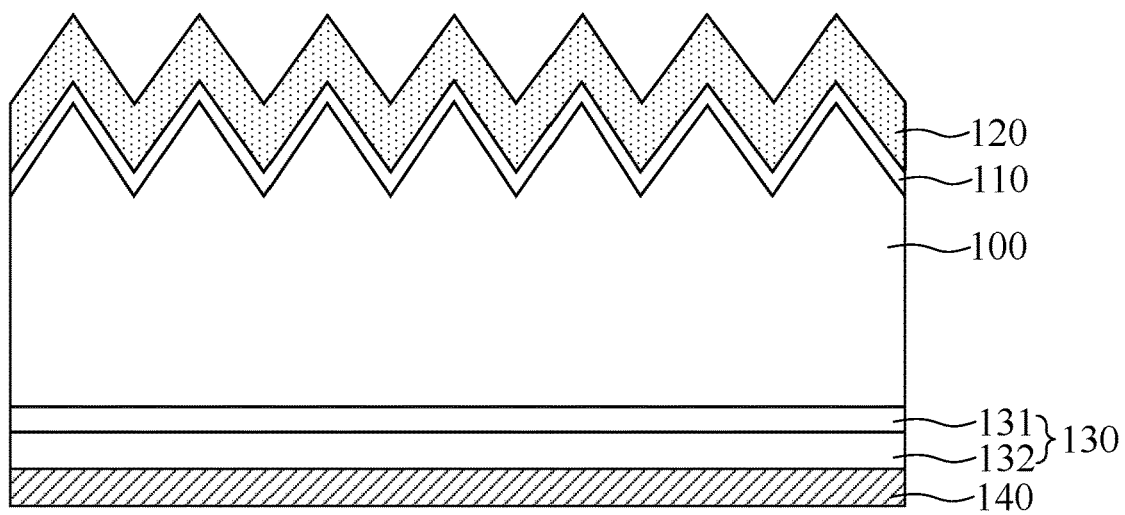
FIG. 6 is a top view of a solar cell corresponding to an operation of forming an antireflection layer in a method for preparing a solar cell provided according to an embodiment of the present disclosure.

Referring to FIG. 6, in some embodiments, in response to the second passivation layer 130 including a second tunneling layer 131 and a second doped conductive layer 132, the method for preparing a solar cell further includes an operation of forming an antireflection layer 140 on the surface of the second passivation layer 130. The antireflection layer 140 is configured to reduce the reflection of the incident light on the second surface of the substrate 100, thereby increasing the absorption and utilization rate of the incident lights on the substrate 100. In some embodiments, the antireflection layer 140 is a single-layer or multi-layer structure, and the material of the antireflection layer 140 is at least one of aluminum oxide, silicon oxide, silicon nitride or silicon oxynitride.

In some embodiments, the antireflection layer 140 is formed by using the PECVD process.

In some embodiments, the material of the second passivation layer is at least one of silicon oxide, silicon nitride, aluminum oxide or silicon oxynitride, that is, the second passivation layer 130 plays the role of passivation and antireflection. In some embodiments, in response to the doped layer 110 being used to form an emitter, the material of the second passivation layer 130 is at least one of silicon oxide, silicon nitride, aluminum oxide or silicon oxynitride, and the formed solar cell can be a PERC.

Figure 7:
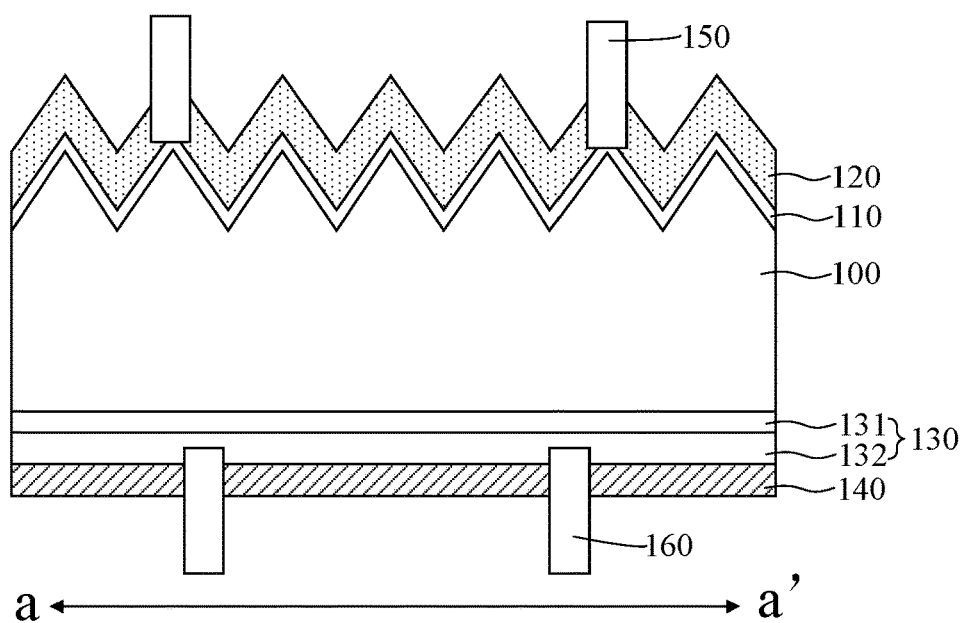
FIG. 7 is a top view of another solar cell corresponding to an operation of forming multiple first grid line electrodes and multiple second grid line electrodes in a method for preparing a solar cell provided according to an embodiment of the present disclosure.
Figure 8:
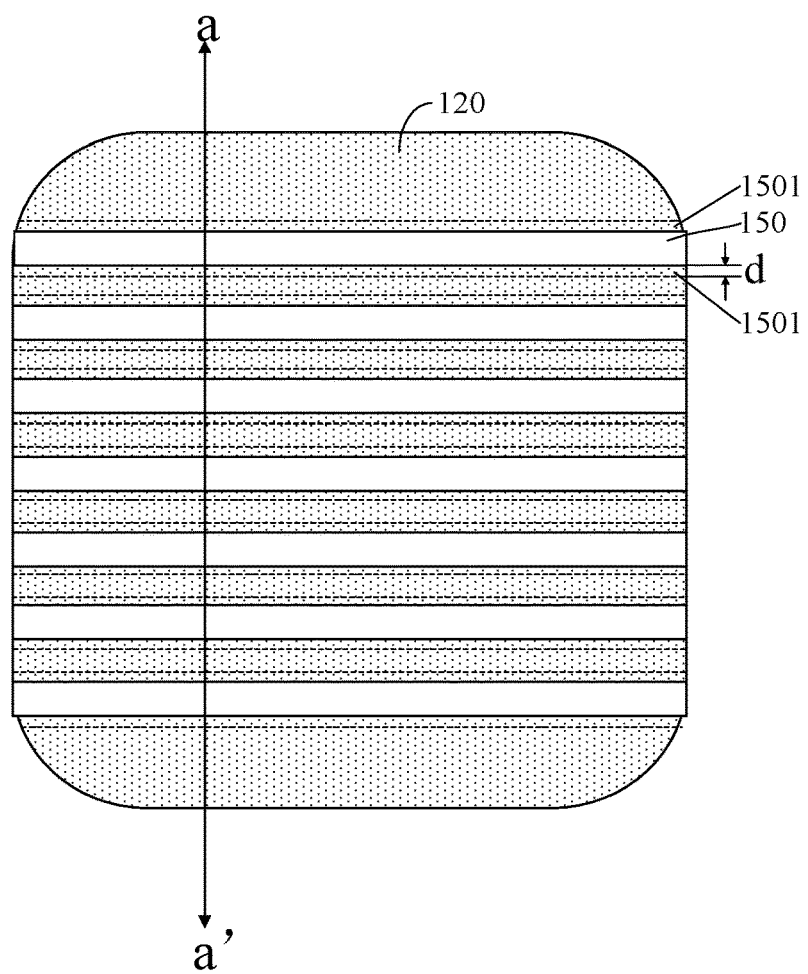
FIG. 8 is a top view of a solar cell corresponding to an operation of forming multiple first grid line electrodes in a method for preparing a solar cell provided according to an embodiment of the present disclosure.

Referring to FIG. 7 and FIG. 8, FIG. 7 is a cross-sectional view of a solar cell shown in FIG. 8 along the aa' direction. Multiple first grid line electrodes 150 spaced at intervals are formed on the surface of the first passivation layer 120 using a sintering process.

In some embodiments, in response to the doped layer 110 being served as the emitter, the multiple first grid line electrodes 150 are electrically connected to the emitter, and the multiple first grid line electrodes 150 are configured to collect carriers in the emitter. In some embodiments, in response to the doped layer 110 being a passivated contact structure, the multiple first grid line electrodes 150 are electrically connected to the first doped conductive layer 112, and the multiple first grid line electrodes 150 are configured to collect carriers in the first doped conductive layer 112.

In some embodiments, an operation of forming a first grid line electrode 150 on the surface of the first passivation layer 120 by performing a sintering process includes the following operations.

Metal paste is printed on a part the surface of the first passivation layer 120 away from the substrate where the multiple first grid line electrodes and the multiple second grid line electrodes are to be formed. In some embodiments, the metal paste contains materials with high corrosive components such as glass powder. Therefore, during the sintering process, the corrosive components will corrode the passivation layer and a part of the doped layer 110, which causes the metal paste to penetrate through the passivation layer and the part of the doped layer 110. In some embodiments, a screen-printing process can be used to print metal paste on the part the surface of the first passivation layer 120 away from the substrate where the multiple first grid line electrodes and the multiple second grid line electrodes are to be formed. In some embodiments, the material of the metal paste includes silver.

Undersintering treatment is performed on the metal paste to enable the metal paste to penetrate through the first passivation layer 120 to be in electrical contact with the doped layer 110. The undersintering treatment refers to heating the metal paste with a lower temperature compared to sintering treatment, in order to allow the metal paste to penetrate into the doped layer 110.

In some embodiments, a peak temperature of the undersintering treatment is between 200 degrees Celsius and 750 degrees Celsius. For example, it may between 200 degrees Celsius and 250 degrees Celsius, 250 degrees Celsius and 300 degrees Celsius, 300 degrees Celsius and 350 degrees Celsius, 350 degrees Celsius and 390 degrees Celsius, 390 degrees Celsius and 440 degrees Celsius, 440 degrees Celsius and 490 degrees Celsius, 490 degrees Celsius and 530 degrees Celsius, 530 degrees Celsius and 580 degrees Celsius, 580 degrees Celsius and 640 degrees Celsius, 640 degrees Celsius and 660 degrees Celsius, 660 degrees Celsius and 700 degrees Celsius, or 700 degrees Celsius and 750 degrees Celsius. Within this temperature range, the heat treatment temperature is maintained to be low, which can prevent the first passivation layer 120 and the doped layer 110 from being damaged caused by the sintering process. Moreover, due to the lower sintering temperature, the sintering depth of the metal paste in the doped layer 110 is smaller, which can reduce the contact area between the multiple first grid line electrodes 150 and the doped layer 110, thereby enabling the solar cell to obtain higher open circuit voltage.

It can be understood that in response to the sintering depth being small, so that the contact area between the multiple first grid line electrodes 150 and the doped layer 110 is reduced, which affects the filling factor of the solar cell, and makes the filling factor of the solar cell to be smaller. However, in the embodiments of the present disclosure, after the sintering process, an additional operation of performing laser processing and the operation of applying a reverse current to reverse bias the PN junction are added subsequently to form contact points in the doped layer 110 and the first passivation layer 120, which reduces the contact impedance, and improves the filling factor of the solar cell. Therefore, the combination of undersintering treatment, laser treatment and the operation of applying a reverse current to reverse bias the PN junction can simultaneously improve the open circuit voltage and the filling factor, thus improving the photoelectric conversion efficiency of the solar cell.

In addition, within the temperature range of 200 degrees Celsius to 750 degrees Celsius, the heat treatment temperature should not be too low, so that the metal paste can be burned through to the preset depth at this heat treatment temperature.

Referring to FIG. 7, multiple second grid line electrodes 160 spaced at intervals are formed on the surface of the second passivation layer 130.

In some embodiments, when the second passivation layer 130 includes at least a second tunneling layer 131 and a second doped conductive layer 132 sequentially stacked in a direction away from the substrate 100, the multiple second grid line electrodes 160 are electrically connected to the second doped conductive layer 132.

It is worth noting that the operation of forming the multiple second grid line electrodes 160 can be the same as the operation of forming the multiple first grid line electrodes 150, that is, metal paste can be printed on the surface of the second passivation layer 130, and a sintering process is performed on the metal paste to form the multiple second grid line electrode 160. Reference of the specific operation can is made to the description of forming the multiple first grid line electrodes 150.

Referring to FIG. 8, a laser processing is performed on the multiple first grid line electrodes 150 and an adjacent region 1501 of each of the multiple first grid line electrodes 150, and a reverse current is applied between the multiple first grid line electrodes 150 and the multiple second grid line electrodes 160 to reverse bias the PN junction in a same processing operation. The adjacent region 1501 is defined as a region within a preset distance d from two edges of each of the multiple first grid line electrodes 150 farthest from the substrate 100. That is, a top edge and a bottom edge of each of the multiple first grid line electrodes 150 along the a-a' direction.

A laser processing is performed on the multiple first grid line electrodes 150 and an adjacent region 1501 of each of the multiple first grid line electrodes 150 on the first surface, and a reverse current is applied between the multiple first grid line electrodes 150 and the multiple second grid line electrodes 160 to reverse bias the PN junction in a same processing operation. Under laser irradiation, a large number of carriers are generated in the multiple first grid line electrodes 150 and an adjacent region 1501 of each of the multiple first grid line electrodes 150. In addition, due to the reverse bias of the PN junction, electrons in the carriers can be trapped in the doped layer 110 and on a surface of each of the multiple first grid line electrodes 150, which in turn reacts with the multiple first grid line electrodes 150, to promote the precipitation of metal ions in the multiple first grid line electrodes 150 to form metal micelles. The metal micelles form conductive contact points in the doped layer 110 and the first passivation layer 120, which can reduce the contact impedance, thus improving the filling factor of the solar cell and improving the photoelectric conversion efficiency of the solar cell.

In some embodiments, the metal paste includes silver, which has good conductivity. Silver ions in the multiple first grid line electrodes 150 precipitate to form silver micelles. Silver micelles form conductive contact points on the doped layer 110, the first passivation layer 120, and the first surface, which reduces contact impedance, not only increases the filling factor, but also improves the efficiency of carrier transmission to the multiple first grid line electrodes 150, thus improving the collection capacity of the multiple first grid line electrodes 150 for carriers.

Due to the reaction between the carriers generated by the laser processing and the multiple first grid line electrodes 150, laser irradiation is performed on the multiple first grid line electrodes 150 and the adjacent region 1501 of each of the multiple first grid line electrodes 150, which allows the generation of more carriers in the adjacent region 1501 of each of the multiple first grid line electrodes 150, resulting in a shorter distance for carriers to be transmitted to the multiple first grid line electrodes 150, thereby reducing transmission loss. Most of the carriers generated by the laser processing can react with the multiple first grid line electrodes 150, to improve the reaction efficiency.

In addition, due to the fact that only the multiple first grid line electrodes 150 and the adjacent region 1501 of each of the multiple first grid line electrodes 150 are subjected to laser processing, the area of the solar cell treated by the laser process is smaller, the time of the laser process is shortened, and thus the processing efficiency can be improved.

It can be understood that the laser used in the laser processing can be irradiated into the doped layer 110 or the substrate 100 to generate more carriers in the doped layer 110 or the substrate 100.

In some embodiments, the preset distance d is not greater than 1.5 cm. In some embodiments, the preset distance d can be equal to 1.5 cm. In some embodiments, the preset distance d can also be less than 1.5 cm, such as 0.005 cm, 0.01 cm, 0.015 cm, 0.02 cm, 0.05 cm, 0.1 cm, 0.2 cm, 0.4 cm, 0.5 cm, 0.6 cm, 0.8 cm, 1 cm, 1.2 cm, 1.3 cm, or 1.5 cm. In this way, on the one hand, the adjacent region 1501 can be wider, so that the laser processing can process a larger area, thus generating more carriers, so that more carriers can react with the multiple first grid line electrodes 150 to separate out metal ions, thus forming more contact points, which is conducive to improving the filling factor. In addition, within this range, the preset distance d is not excessive, which can improve the efficiency of the laser processing.

In some embodiments, the preset distance d can also be greater than 1.5 cm. For example, laser irradiation can be applied to all areas of the first surface except for the multiple first grid line electrodes 150, resulting in a larger number of carriers generated, allowing more electrons to react with the multiple first grid line electrodes 150, thereby promoting the precipitation of metal ions in the multiple first grid line electrodes 150, and forming more contact points.

In some embodiments, the laser processing has a power of 1 W to 60 W, for example, it can be 1 W to 5 W, 5 W to 10 W, 10 W to 15 W, 15 W to 20 W, 20 W to 25 W, 25 W to 30 W, 30 W to 35 W, 35 W to 40 W, 45 W to 50 W, 50 W to 55 W, or 55 W to 60 W. And the laser processing has a scanning speed of 2000 mm/s to 50000 mm/s, for example, it can be 2000 mm/s to 5000 mm/s, 5000 mm/s to 8000 mm/s, 8000 mm/s to 10000 mm/s, 10000 mm/s to 12000 mm/s, 12000 mm/s to 16000 mm/s, 16000 mm/s to 1900 mm/s, 19000 mm/s to 25000 mm/s, 25000 mm/s to 30000 mm/s, 30000 mm/s to 35000 mm/s to 40000 mm/s, 40000 mm/s to 45000 mm/s or 45000 mm/s to 50000 mm/s. Within this range, the laser energy generated by the laser process can reach the doped layer 110 or substrate 100, thereby generating carriers in the emitter and substrate 100. Moreover, within this range, more carriers are generated, which in turn allows more carriers to react with the multiple first grid line electrodes 150. In addition, within this range, the laser energy of the laser process is not too large, preventing thermal damage to the substrate 100 and the multiple first grid line electrodes 150 caused by the laser energy.

In some embodiments, the laser used for laser processing is any one of infrared laser, green laser, ultraviolet laser or ultraviolet green infrared laser, and the laser device used for laser processing is any one of $CO_2$ laser device, excimer laser device, titanium sapphire laser device, semiconductor laser device or high-power short pulse (fs-ns) laser device.

For different laser devices, different laser powers, pulse widths, or scanning speeds can be set to produce a larger number of carriers.

For example, in some embodiments, the laser device is a nanosecond green laser with a pulse width of 1 ns to 200 ns, such as 1 ns to 10 ns, 10 ns to 20 ns, 20 ns to 35 ns, 35 ns to 40 ns, 40 ns to 60 ns, 60 ns to 80 ns, 80 ns to 110 ns, 110 ns to 150 ns, 150 ns to 180 ns, or 180 ns to 200 ns. The laser power is 1 W to 30 W, for example, it can be 1 W to 30 W, 1 W to 5 W, 5 W to 8 W, 8 W to 12 W, 12 W to 16 W, 16 W to 19 W, 19 W to 22 W, 22 W to 26 W, 26 W to 28 W or 28 W to 30 W. The scanning speed is 2000 mm/s to 50000 mm/s, for example, it can be 2000 mm/s to 5000 mm/s, 5000 mm/s to 8000 mm/s, 8000 mm/s to 10000 mm/s, 10000 mm/s to 12000 mm/s, 12000 mm/s to 16000 mm/s, 16000 mm/s to 1900 mm/s, 19000 mm/s to 25000 mm/s, 25000 mm/s to 30000 mm/s, 30000 mm/s to 35000 mm/s to 40000 mm/s, 40000 mm/s to 45000 mm/s or 45000 mm/s to 50000 mm/s.

In some embodiments, the operation of performing the laser processing on the multiple first grid line electrodes 150 and the adjacent region 1501 of each of the multiple first grid line electrodes 150 includes: continuously scanning the adjacent region 1501 of each of the multiple first grid line electrodes 150 and the multiple first grid line electrodes 150 using a laser device to form a laser processed region in the adjacent region 1501 of each of the multiple first grid line electrodes 150 and the multiple first grid line electrodes 150, where a projection of the laser processed region on the surface of the first passivation layer 120 away from the substrate 100 covers the adjacent region 1501 of each of the multiple first grid line electrodes 150 and the multiple first grid line electrodes 150. That is to say, all of the adjacent region 1501 of each of the multiple first grid line electrodes 150 and the multiple first grid line electrodes 150 are treated as the region to be laser treated. In the laser processing, each part of the adjacent region 1501 of each of the multiple first grid line electrodes 150 and the multiple first grid line electrodes 150 is laser processed, so that the adjacent region 1501 of each of the multiple first grid line electrodes 150 and the multiple first grid line electrodes 150 are converted into the laser treated region, resulting in a larger area of the laser treated region. Furthermore, more carriers can be generated, which enables more carriers to react with the multiple first grid line electrodes 150, resulting in the precipitation of more metal ions to generate more contact points on the doped layer 110, the multiple first grid line electrodes 150, and the first surface.

Figure 9:
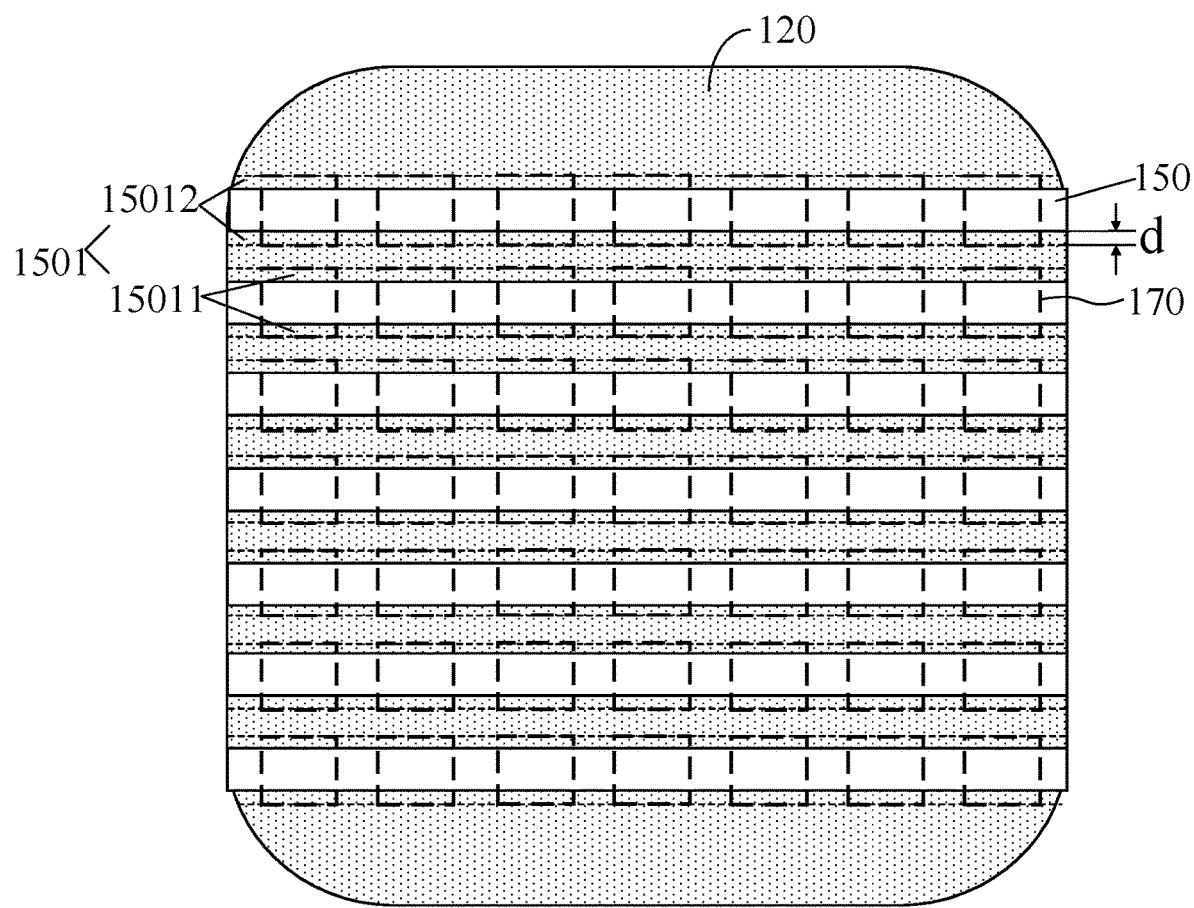
FIG. 9 is a top view of a solar cell corresponding to an operation of performing a laser processing in a method for preparing a solar cell provided according to an embodiment of the present disclosure.

Referring to FIG. 9, in some embodiments, the operation of performing the laser processing on the multiple first grid line electrodes 150 and the adjacent region 1501 of each of the multiple first grid line electrodes includes: discontinuously scanning the adjacent region 1501 of each of the multiple first grid line electrodes 150 and the multiple first grid line electrodes 150 using a laser device to form multiple laser processed regions 170 spaced apart from each other in the adjacent region 1501 of each of the multiple first grid line electrodes 150 and the multiple first grid line electrodes 150. That is to say, the multiple first grid line electrodes 150 and the adjacent region 1501 of each of the multiple first grid line electrodes 150 are graphically scanned, so that a part of the multiple first grid line electrodes 150 and the adjacent region 15011 of each of the part of the multiple first grid line electrodes 150 are laser processed, to form the multiple laser processed regions 170. A remaining part of the multiple first grid line electrodes 150 and the adjacent region 15012 of each of the remaining part of the multiple first grid line electrodes 150 are not laser processed, which makes the area of the formed laser processed region 170 smaller. That is, the adjacent region 1501 of each of the multiple first grid line electrodes 150 includes the adjacent region 15011 of the part of multiple first grid line electrodes 150 being laser processed and the adjacent region 15012 of the remaining part of the multiple first grid line electrodes 150 not being laser processed. In this way, the area of the laser processed region 170 can be adjusted through the scanning operation of the laser processing, thereby regulating the number of generated carriers to meet the demand.

Due to the electrical contact between the multiple first grid line electrodes 150 and the doped layer 110, which forms a PN junction with the substrate 100. In response to the PN junction being reverse biased, electrons in the carriers can be trapped, and the trapped electrons can react with the multiple first grid line electrodes 150. Therefore, in some embodiments, laser processing is performed on the adjacent region 1501 of each of the multiple first grid line electrodes 150 and the multiple first grid line electrodes 150, Thus, the generated carriers are closer to the multiple first grid line electrodes 150, and after the PN junction is reverse biased, the carriers generated in the adjacent region 1501 of each of the multiple first grid line electrodes 150 can quickly react with the multiple first grid line electrodes 150, thereby increasing the number of contact points generated.

In some embodiments, the adjacent region 1501 of each of the multiple first grid line electrodes 150, the multiple first grid line electrodes 150, the multiple second grid line electrodes 160, and the adjacent region of the multiple second grid line electrodes 160 can be simultaneously laser processed.

Figure 10:
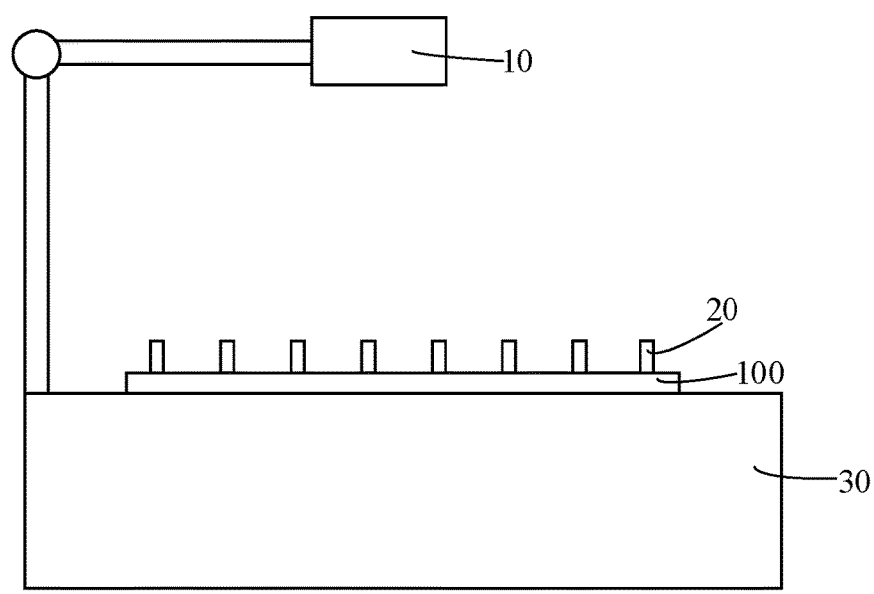
FIG. 10 is a side view of a solar cell corresponding to an operation of performing a laser processing in a method for preparing a solar cell provided according to an embodiment of the present disclosure.

Referring to FIG. 10, in some embodiments, the laser device 10 used in the laser processing is a mobile laser device 10 located above the multiple first grid line electrodes 150 (referring to FIG. 9). In response to the laser device 10 emitting laser, by moving the laser 10, laser scanning of the multiple first grid line electrodes 150 and adjacent regions of the multiple first grid line electrodes 150 can be achieved.

Reverse current refers to the current flowing between the multiple first grid line electrodes 150 and the multiple second grid line electrodes 160, which causes the current flowing through the PN junction to flow from the N region to the P region, resulting in a reverse bias of the PN junction. That is, the built-in electric field in the PN junction is in the same direction as the external electric field, and the PN junction is not conductive. Therefore, the electrons in the carrier can be trapped in the doped layer 110. In some embodiments, the magnitude of the reverse current is 1 A to 40 A, such as 1 A to 5 A, 5 A to 10 A, 10 A to 15 A, 15 A to 20 A, 20 A to 25 A, 25 A to 30 A, 30 A to 35 A, or 35 A to 40 A. Within this range, it is possible to ensure reverse bias of the PN junction and imprison a large number of carriers on the surface of the doped layer 110 and the multiple first grid line electrodes 150, thereby causing the electrons in the carriers to react with the multiple first grid line electrodes 150, and promoting the precipitation of metal ions in the multiple first grid line electrodes 150.

In some embodiments, the operation of applying reverse current between the multiple first grid line electrodes 150 and the multiple second grid line electrodes 160 includes providing a power supply, electrically connecting a negative electrode of the power supply to one of the multiple first grid line electrodes 150 or the multiple second grid line electrodes 160, electrically connecting a positive electrode of the power supply to the other one of the multiple first grid line electrodes 150 or the multiple second grid line electrodes 160 to apply the reverse current between the multiple first grid line electrodes 150 and the multiple second grid line electrodes 160. Due to the fact that the multiple first grid line electrodes 150 and the multiple second grid line electrodes 160 are located on opposite surfaces of the substrate 100, in response to a reverse bias being applied between the multiple first grid line electrodes 150 and the multiple second grid line electrodes 160, a circuit can be formed between the substrate 100 and the doped layer 110. Among them, the multiple first grid line electrodes 150 or the multiple second grid line electrodes 160 electrically connected to the negative electrode of the power supply is electrically connected to the P region in the PN junction, and the multiple first grid line electrodes 150 or the multiple second grid line electrodes 160 electrically connected to the positive electrode of the power supply is electrically connected to the N region in the PN junction, so that the voltage in the N region is higher than the voltage in the P region in the PN junction, and the current flows from the N region to the P region, thereby making the PN junction to be non-conductive.

In some embodiments, the doping element type in the doped layer 110 is P-type, and the doping element type in the substrate 100 is N-type. That is to say, the substrate 100 is configured to form the N region in the PN junction, and the doped layer 110 is configured to form the P region in the PN junction. Based on this, in some embodiments, the operation of applying reverse current between the multiple first grid line electrodes 150 and the multiple second grid line electrodes 160 includes: electrically connecting the negative electrode of the power supply to the multiple first grid line electrodes 150, and electrically connecting the positive electrode of the power supply to the multiple second grid line electrodes 160. That is, the negative electrode of the power supply is electrically connected to the P region, and the positive electrode of the power supply is electrically connected to the N region, which causes the voltage in the N region to be higher than the voltage in the P region, to form a reverse bias between the PN junctions.

In some embodiments, in response to the doping element type in the doped layer 110 being N-type and the doping element type in the substrate 100 being P-type, the negative electrode of the power supply is electrically connected to the multiple second grid line electrodes 160, and the positive electrode of the power supply is electrically connected to the multiple first grid line electrodes 150, so that the N-region is connected to the positive electrode of the power supply, and the P-region is connected to the negative electrode of the power supply.

Figure 11:
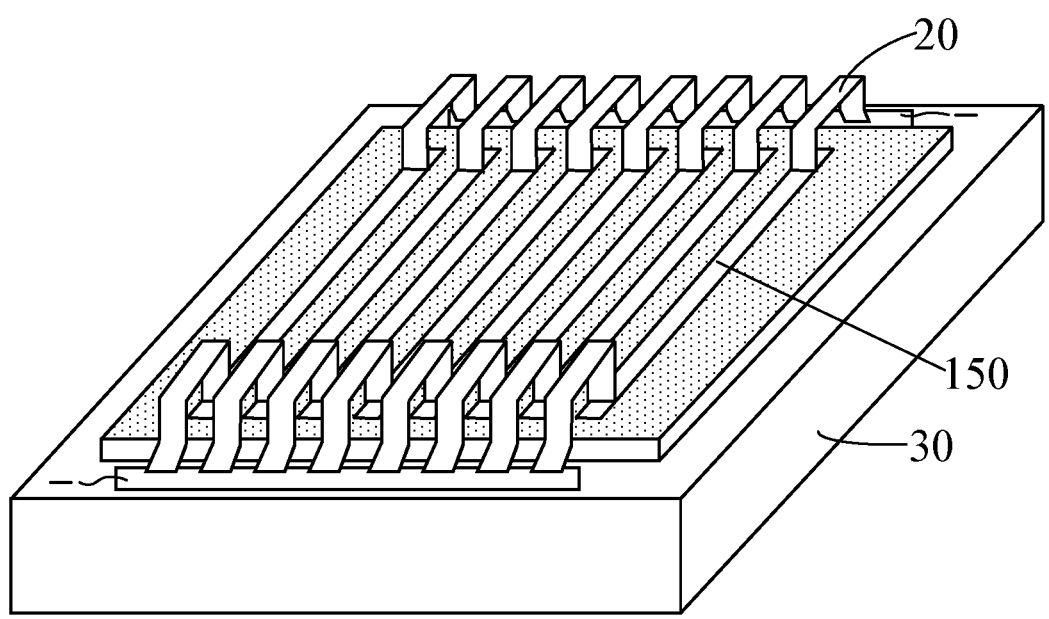
FIG. 11 is a three-dimensional view of a solar cell corresponding to an operation of performing a laser processing in a method for preparing a solar cell provided according to an embodiment of the present disclosure.

Referring to FIG. 7, FIG. 10, and FIG. 11, in some embodiments, in response to the doping element type in the doped layer 110 being P-type and the doping element type in the substrate 100 being N-type, the power supply further includes a fixture. The multiple first grid line electrodes are electrically connected to the negative electrode of the power supply by the fixture, the fixture is electrically connected to the negative electrode of the power supply, and the fixture is further in electrical contact with at least an end of each of the multiple first grid line electrodes 150. The fixture 20 is electrically connected to the negative electrode of the power supply to lead out the electrical signal of the negative electrode of the power supply. In some embodiments, the fixture 20 is electrically connected to the negative electrode of the power supply through a wire. The fixture 20 is in electrical contact with at least one end of the multiple first grid line electrodes 150. On the one hand, the fixture is configured to transmit the signal of the negative electrode of the power supply to the multiple first grid line electrodes 150, so that the multiple first grid line electrodes 150 are connected to the negative electrode. On the other hand, since the fixture 20 is only electrically connected to the end of each of the multiple first grid line electrodes 150, it can avoid excessive obstruction on the surface of the multiple first grid line electrodes 150, so that during laser processing, laser irradiation is applied to the adjacent region of the multiple first grid line electrodes 150 and the multiple first grid line electrodes 150.

In some embodiments, the fixture 20 is only in electrical contact with one end of each of the multiple first grid line electrodes 150. In some embodiments, in order to improve the reliability of the electrical contact between the fixture 20 and the multiple first grid line electrodes 150, both ends of the fixture 20 and the multiple first grid line electrodes 150 are arranged to be in contact, thereby enhancing the transmission rate of signal from the negative electrode of the power supply to the multiple first grid line electrodes 150.

It can be understood that in the operation of laser processing, due to the thermal effect generated by the laser on the multiple first grid line electrodes 150 and the adjacent region of the multiple first grid line electrodes 150, the temperature of the multiple first grid line electrodes 150 or the adjacent region of the multiple first grid line electrodes 150 may be too high, resulting in adverse reactions to the film layer of the multiple first grid line electrodes 150 and the adjacent region of the multiple first grid line electrodes 150. For example, the performance of the first passivation layer 120, doped layer 110, or substrate 100 close to the multiple first grid line electrodes 150 may be affected, thereby damaging the photoelectric conversion performance of the solar cell.

Based on the above considerations, in some embodiments, in the operation of laser processing, the method further includes controlling temperature of the adjacent region of the multiple first grid line electrodes 150 and the multiple first grid line electrodes 150 to be less than or equal to 50 degrees Celsius. In this way, during laser processing the multiple first grid line electrodes 150 and the adjacent region of the multiple first grid line electrodes 150, the adjacent region of the multiple first grid line electrodes 150 and the multiple first grid line electrodes 150 are prevented from being overheated.

In some embodiments, the operation of controlling the temperature of the multiple first grid line electrodes 150 and the adjacent region of the multiple first grid line electrodes 150 includes the following operations.

Referring to FIG. 7, FIG. 10, and FIG. 11, a temperature control panel 30 is provided, which has a temperature control interface configured to adjust temperature. In some embodiments, a cooling system can be installed in the temperature control panel 30, which is configured to adjust the temperature of the temperature control surface. In some embodiments, the cooling system may be a water-cooling system.

The solar cell is placed on the temperature control surface of the temperature control panel 30. Due to the need for laser processing the multiple first grid line electrodes 150 and the adjacent region of the multiple first grid line electrodes 150, one side of the multiple second grid line electrodes 160 is placed on the temperature control surface to laser process the adjacent region of the multiple first grid line electrodes 150 and the multiple first grid line electrodes 150.

The temperature of the temperature control surface is controlled, in some embodiments, it is possible to control the temperature of the temperature control surface to be lower, resulting in a lower surface temperature of the multiple second grid line electrodes 160 and the second passivation layer 130, thereby causing heat exchange between the multiple first grid line electrodes 150 and the adjacent region of the multiple first grid line electrodes 150 with higher temperature, such as the first passivation layer 120, and the multiple second grid line electrodes 160 and the second passivation layer 130 with lower temperature. Furthermore, cooling is applied to the adjacent region of the multiple first grid line electrodes 150 and the multiple first grid line electrodes 150.

It is not difficult to find that the multiple second grid line electrodes 160 and the second passivation layer 130 are located on the temperature control surface, which enables the temperature of the entire second passivation layer 130 to be regulated, thereby causing heat exchange between the entire first passivation layer 120, the multiple first grid line electrodes 150, the second passivation layer 130, and the multiple second grid line electrodes 160, which is conducive to maintaining the overall temperature balance of the solar cell.

In the method for preparing a solar cell provided according to the embodiments of the present disclosure, a laser processing is performed on the multiple first grid line electrodes 150 and an adjacent region of the multiple first grid line electrodes 150 on the first surface, and a reverse current is applied between the multiple first grid line electrodes 150 and the multiple second grid line electrodes 160 to reverse bias the PN junction. Under laser irradiation, a large number of carriers are generated in the multiple first grid line electrodes 150 and the adjacent region of the multiple first grid line electrodes 150. In addition, due to the reverse bias of the PN junction, electrons in the carriers can be trapped in the doped layer 110 and on a surface of each of the multiple first grid line electrodes 150, which in turn reacts with the multiple first grid line electrodes 150, to promote the precipitation of metal ions in the multiple first grid line electrodes 150 to form metal micelles. The metal micelles form conductive contact points in the doped layer 110 and the first passivation layer 120, which can reduce the contact impedance, thus improving the filling factor of the solar cell and improving the photoelectric conversion efficiency of the solar cell.

In addition, a solar cell is further provided according to the embodiments of the present disclosure. The solar cell is prepared by using the method for preparing a solar cell according to any of above embodiments, and the solar cell includes a substrate 100 having a first surface and a second surface opposite to the first surface; a doped layer 110 and a first passivation layer 120 stacked sequentially on the first surface in a direction away from the substrate, where the doped layer 110 forms a PN junction with the substrate 100. The solar cell further includes a second passivation layer 130 on the second surface, multiple first grid line electrodes 150 arranged at intervals on a surface of the first passivation layer 120 away from the substrate 100, and multiple second grid line electrodes 160 arranged at intervals on a surface of the second passivation layer 130 away from the substrate 100.

After the multiple first grid line electrodes 150 and the multiple second grid line electrodes 160 are formed, a laser processing is performed on the multiple first grid line electrodes 150 and an adjacent region of the multiple first grid line electrodes 150 on the first surface, and a reverse current is applied between the multiple first grid line electrodes 150 and the multiple second grid line electrodes 160 to reverse bias the PN junction in a same processing operation, so that electrons in the carriers can be trapped in the doped layer 110 and on a surface of each of the multiple first grid line electrodes 150, which in turn reacts with the multiple first grid line electrodes 150, to promote the precipitation of metal ions in the multiple first grid line electrodes 150 to form metal micelles. The metal micelles form conductive contact points in the doped layer 110 and the first passivation layer 120, which can reduce the contact impedance, thus improving the filling factor of the solar cell and improving the photoelectric conversion efficiency of the solar cell.

In some embodiments, the doped layer 110 has a same material as the substrate 100, and the doped layer 110 is served as the emitter of the solar cell. The doped layer 110 has a single-layer structure, and the doped layer 110 has different types of doping elements from the substrate 100, to form a PN junction with the substrate 100. The multiple first grid line electrodes 150 are electrically connected to the doped layer 110.

In some embodiments, the doped layer 110 further includes a first tunneling layer 111 (referring to FIG. 3) and a first doped conductive layer 112 (referring to FIG. 3) stacked sequentially in the direction away from the substrate 100. The first doped conductive layer 112 has different types of doping elements from the substrate 100. The first tunneling layer 111 and the first doped conductive layer 112 are configured to form a passivated contact structure. The multiple first grid line electrodes 150 are electrically connected to the first doped conductive layer 112.

The first passivation layer 120 can achieve good passivation effect on the first surface of the substrate 100. In some embodiments, the first passivation layer 120 may be a single-layer structure, while in other embodiments, the first passivation layer 120 may also be a multi-layer structure. In some embodiments, the material of the first passivation layer 120 is at least one of silicon oxide, aluminum oxide, silicon nitride or silicon oxynitride. The multiple first grid line electrodes 150 penetrate through the first passivation layer 120 to be electrically connected to the doped layer 110.

In some embodiments, the second passivation layer 130 includes at least a second tunneling layer 131 and a second doped conductive layer 132 sequentially stacked in the direction away from the substrate 100. The second doped conductive layer 132 has the same type of doping elements as the substrate 100. That is to say, the second passivation layer 130 is configured to form a passivated contact structure. The multiple second grid line electrodes 160 are electrically connected to the second doped conductive layer 132.

In some embodiments, in response to the second passivation layer 130 including a second tunneling layer 131 and a second doped conductive layer 132, the method for preparing a solar cell further includes an operation of forming an antireflection layer 140 on the surface of the second passivation layer 130. The antireflection layer 140 is configured to reduce the reflection of the incident light on the second surface of the substrate 100, thereby increasing the absorption and utilization rate of the incident lights on the substrate 100. In some embodiments, the antireflection layer 140 is a single-layer or multi-layer structure, and the material of the antireflection layer 140 is at least one of aluminum oxide, silicon oxide, silicon nitride or silicon oxynitride.

In some embodiments, the material of the second passivation layer 130 is at least one of silicon oxide, silicon nitride, aluminum oxide or silicon oxynitride, that is, the second passivation layer 130 plays the role of passivation and antireflection rather than being the passivated contact structure.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present disclosure is disclosed above with preferred embodiments, it is not used to limit the claims. Any person skilled in the art may make some possible changes and modifications without departing from the concept of the present disclosure. The scope of protection shall be subject to the scope defined by the claims of the present disclosure. In addition, the embodiments, and the accompanying drawings in the specification of the present disclosure are only illustrative examples, which will not limit the scope protected by the claims of the present disclosure.

Those of ordinary skill in the art can understand that the above embodiments are specific examples for realizing the present disclosure, and in actual disclosures, various changes may be made in shape and details without departing from the spirit and range of the present disclosure. Any person skilled in the art can make their own changes and modifications without departing from the spirit and scope of the present disclosure. Therefore, the protection scope of the present disclosure should be subject to the scope defined by the claims.

What is claimed is:

1. A method for preparing a solar cell, comprising:
providing a substrate having a first surface and a second surface opposite to the first surface;
forming a doped layer over the first surface of the substrate and a first passivation layer over the doped layer, wherein the doped layer forms a PN junction with the substrate;
forming a second passivation layer on the second surface;
performing a sintering process on a surface of the first passivation layer away from the substrate to form a plurality of first grid line electrodes arranged at intervals on the surface of the first passivation layer;
performing a sintering process on a surface of the second passivation layer away from the substrate to form a plurality of second grid line electrodes arranged at intervals on the surface of the second passivation layer; and
performing laser processing, including applying laser irradiation on the plurality of first grid line electrodes and regions adjacent to the plurality of first grid line electrodes and applying a reverse current between the plurality of first grid line electrodes and the plurality of second grid line electrodes to reverse bias the PN junction during the laser processing, wherein the laser processing promotes precipitation of metal ions in the plurality of first grid line electrodes to form metal micelles, and wherein each of the regions adjacent to the plurality of first gridline electrodes is a region within a preset distance from an edge of one of the plurality of first grid line electrodes.

2. The method for preparing a solar cell according to claim 1, wherein the preset distance is not greater than 1.5 cm.

3. Wherein the laser processing has a power of 1 W to 60 W and a scanning speed of 2000 mm/s to 50000 mm/s.

4. The method for preparing a solar cell according to claim 3, wherein performing the laser processing on the plurality of first grid line electrodes and the adjacent region of the plurality of first grid line electrodes includes: continuously scanning the adjacent region of the plurality of first grid line electrodes and the plurality of first grid line electrodes using a laser device to form a laser processed region in the adjacent region of the plurality of first grid line electrodes and the plurality of first grid line electrodes, wherein a projection of the laser processed region on the surface of the first passivation layer away from the substrate covers the adjacent region of the plurality of first grid line electrodes and the plurality of first grid line electrodes.

5. The method for preparing a solar cell according to claim 3, wherein performing the laser processing on the plurality of first grid line electrodes and the adjacent region of the plurality of first grid line electrodes includes: discontinuously scanning the adjacent region of the plurality of first grid line electrodes and the plurality of first grid line electrodes using a laser device to form a plurality of laser processed regions spaced apart from each other in the adjacent region of the plurality of first grid line electrodes and the plurality of first grid line electrodes.

6. The method for preparing a solar cell according to claim 4, wherein the laser device is a nanosecond level green laser device having a pulse width of 1ns to 200 ns, a laser power of 1 W to 30 W, and a scanning speed of 2000 mm/s to 50000 mm/s.

7. The method for preparing a solar cell according to claim 1, wherein the reverse current is between 1 A and 40 A.

8. The method for preparing a solar cell according to claim 1, wherein applying the reverse current between the plurality of first grid line electrodes and the plurality of second grid line electrodes includes: providing a power supply, electrically connecting a negative electrode of the power supply to one of the plurality of first grid line electrodes or the plurality of second grid line electrodes, electrically connecting a positive electrode of the power supply to the other one of the plurality of first grid line electrodes or the plurality of second grid line electrodes to apply the reverse current between the plurality of first grid line electrodes and the plurality of second grid line electrodes.

9. The method for preparing a solar cell according to claim 8, wherein the doped layer has P-type doping elements, and the substrate has N-type doping elements.

10. The method for preparing a solar cell according to claim 9, wherein applying the reverse current between the plurality of first grid line electrodes and the plurality of second grid line electrodes includes: electrically connecting the negative electrode of the power supply to the plurality of first grid line electrodes, and electrically connecting the positive electrode of the power supply to the plurality of second grid line electrodes.

11. The method for preparing a solar cell according to claim 10, wherein the power supply further includes a fixture, wherein the plurality of first grid line electrodes are electrically connected to the negative electrode of the power supply by the fixture, the fixture is electrically connected to the negative electrode of the power supply, and the fixture is further in electrical contact with at least an end of each of the plurality of first grid line electrodes.

12. The method for preparing a solar cell according to claim 1, wherein performing the laser processing on the plurality of first grid line electrodes and the adjacent region of the plurality of first grid line electrodes further includes controlling temperature of the adjacent region of the plurality of first grid line electrodes and the plurality of first grid line electrodes to be less than or equal to 50 degrees Celsius.

13. The method for preparing a solar cell according to claim 1, wherein performing a sintering process on a surface of the first passivation layer away from the substrate to form a plurality of first grid line electrodes arranged at intervals on the surface of the first passivation layer away from the substrate includes:
printing metal paste on a part the surface of the first passivation layer away from the substrate where the plurality of first grid line electrodes and the plurality of second grid line electrodes are to be formed;
performing undersintering treatment on the metal paste to enable the metal paste to penetrate through the first passivation layer to be in electrical contact with the doped layer.

14. The method for preparing a solar cell according to claim 13, wherein a peak temperature of the undersintering treatment is between 200 degrees Celsius and 750 degrees Celsius.

15. The method for preparing a solar cell according to claim 1, wherein the doped layer has a same material as the substrate, and the plurality of first grid line electrodes are electrically connected to the doped layer.

16. The method for preparing a solar cell according to claim 1, wherein the doped layer includes a first tunneling layer and a first doped conductive layer sequentially stacked in the direction away from the substrate, the first doped conductive layer has different types of doping elements from the substrate, and the plurality of first grid line electrodes are electrically connected to the first doped conductive layer.

17. The method for preparing a solar cell according to claim 16, wherein the second passivation layer at least includes a second tunneling layer and a second doped conductive layer sequentially stacked in the direction away from the substrate, the second doped conductive layer has a same type of doping elements as the substrate, and the plurality of second grid line electrodes are electrically connected to the first doped conductive layer.

18. The method for preparing a solar cell according to claim 1, wherein a material of the second passivation layer is at least one of silicon oxide, silicon nitride, aluminum oxide or silicon oxynitride.

19. The method for preparing a solar cell according to claim 1, further comprising a providing a temperature control panel having a temperature control interface configured to adjust temperature, and a cooling system installed in the temperature control panel, wherein the cooling system is configured to adjust temperature of the temperature control surface.

* * * * *